US007966968B2

United States Patent
Chan et al.

(10) Patent No.: US 7,966,968 B2
(45) Date of Patent: Jun. 28, 2011

(54) ELECTROLESS PLATING APPARATUS WITH NON-LIQUID HEATING SOURCE

(75) Inventors: Cheng Hsun Chan, Hsin-Chu (TW); Chien Ling Hwang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 459 days.

(21) Appl. No.: 11/796,201

(22) Filed: Apr. 27, 2007

(65) Prior Publication Data

US 2008/0268553 A1    Oct. 30, 2008

(51) Int. Cl.
*B05B 13/02* (2006.01)
*B05C 11/02* (2006.01)

(52) U.S. Cl. .......... 118/642; 118/52; 118/319; 118/320; 118/641

(58) Field of Classification Search .............. 118/52, 118/612, 319, 320, 56, 504, 505, 641–643, 118/58; 427/240; 396/604, 611, 627; 134/153, 134/198, 902
See application file for complete search history.

(56) References Cited

U.S. PATENT DOCUMENTS

| 5,830,805 A | 11/1998 | Shacham-Diamand et al. |
| 6,211,485 B1 * | 4/2001 | Burgess .................. 219/121.7 |
| 6,713,122 B1 | 3/2004 | Mayer et al. |
| 6,830,389 B2 * | 12/2004 | Templeton ................. 396/611 |
| 6,913,651 B2 | 7/2005 | Ivanov et al. |
| 2003/0077399 A1 * | 4/2003 | Potyrailo et al. .............. 427/532 |
| 2004/0234696 A1 * | 11/2004 | Hongo et al. ................. 427/328 |
| 2005/0072525 A1 * | 4/2005 | Pancham et al. ......... 156/345.11 |
| 2005/0088647 A1 * | 4/2005 | Shanmugasundram et al. ............................. 356/72 |
| 2006/0035477 A1 | 2/2006 | Mai et al. |

FOREIGN PATENT DOCUMENTS

| CN | 1633520 A | 6/2005 |
| CN | 2793916 Y | 7/2006 |
| CN | 1900358 A | 1/2007 |
| JP | 09029931 A * | 2/1997 |

OTHER PUBLICATIONS

Computer English Translation JP 09029931A Feb. 1997.*

* cited by examiner

*Primary Examiner* — Yewebdar T Tadesse
(74) *Attorney, Agent, or Firm* — Slater & Matsil, L.L.P.

(57) ABSTRACT

An electroless plating apparatus is provided. The electroless plating apparatus includes a wafer holder; a chemical dispensing nozzle over the wafer holder; a conduit connected to the chemical dispensing nozzle; and a radiation source over the wafer holder.

19 Claims, 6 Drawing Sheets

ELECTROLESS PLATING APPARATUS WITH NON-LIQUID HEATING SOURCE

TECHNICAL FIELD

This invention relates generally to methods and apparatus for electroless plating on semiconductor wafers, and more particularly to methods for controlling heating of semiconductor wafers during electroless plating in order to improve plating uniformity.

BACKGROUND

Electroplating and electroless plating can be used for the deposition of continuous metal layers as well as patterned metal layers. Electroless plating is often used as a preliminary step in preparing a seed layer for conventional electroplating. One of the process sequences used by the microelectronic manufacturing industry to deposit metals onto semiconductor wafers is known to as a "damascene" process. In such a process, via openings, trenches and/or other recesses, are formed in a dielectric layer and filled with a metal, such as copper. The wafer, with vias and trenches etched in the dielectric material, first receives a metallic seed layer, which is used to conduct electrical currents during a subsequent metal electroplating step. If a metal such as copper is used, the seed layer is disposed over a barrier layer material, such as Ti, TiN, etc. The seed layer is a very thin layer of metal typically formed by electroless plating. The subsequent plating on the seed layer is typically electroplating.

FIG. 1 illustrates a conventional apparatus for electroless plating. Wafer 2 is placed on wafer holder 4, which includes guide pins 6 for limiting wafer 2. The chemical dispensing nozzle 8, that dispenses plating chemicals, is connected to a chemical dispenser (not shown). Typically, Electroless plating is performed at elevated temperatures by conducting hot de-ionized (DI) water under wafer 2, wherein wafer 2 may be in direct contact with the DI water. In a typical design, the hot DI water is conducted to the bottom center of a wafer, and then spread to the edges, as illustrated by the arrows. In addition, the plating chemicals may be heated before they are dispensed on the surface of wafer 2.

It is known that temperatures affect chemical reactions, and thus the deposition rate in an electroless plating is also sensitive to the temperatures. In certain cases, for example, in the Ni—P electroless plating process, the deposition rate may increase as high as twofold for every 10-degree increase in the plating temperature. Therefore, it is preferred that the temperature at the surface of wafer 2 is uniform. However, in the conventional heating scheme, when hot DI wafer flows from the bottom center of wafer 2 to the edge, due to heat dissipation, the hot DI water may develop an increasingly lower temperature along its path. The edge portions of wafer 2 accordingly have a lower temperature as compared to the center portion. The temperature difference may be as high as 5 degrees centigrade. This causes a significant variation in deposition rates between the center portion and the edge portions of the wafer.

Therefore, an electroless plating apparatus for uniformly heating a wafer and methods for achieving the same are needed.

SUMMARY OF THE INVENTION

In accordance with one aspect of the present invention, an electroless plating apparatus includes a wafer holder; a chemical dispensing nozzle over the wafer holder; a conduit connected to the chemical dispensing nozzle; and a radiation source over the wafer holder.

In accordance with another aspect of the present invention, an electroless plating apparatus for plating a wafer includes a wafer holder for holding the wafer; a chemical dispensing nozzle over the wafer; a water pipe having an end under the wafer; a focus reflector over the wafer; and at least one lamp attached to the focus reflector.

In accordance with yet another aspect of the present invention, a method for electroless plating a semiconductor wafer includes placing the semiconductor wafer on a wafer holder; heating the semiconductor wafer using a radiation source overlying the semiconductor wafer; and dispensing plating chemicals from a chemical dispenser onto the semiconductor wafer.

In accordance with yet another aspect of the present invention, a method for electroless plating a semiconductor wafer includes placing the semiconductor wafer on a wafer holder; placing a focus reflector over the wafer; attaching a plurality of lamps to the focus reflector; heating the semiconductor wafer with the lamps; conducting hot de-ionized water to a bottom surface of the semiconductor wafer; and dispensing plating chemicals on the semiconductor wafer.

An advantageous feature of the embodiments of the present invention is that the plated wafers will have a substantially uniform temperature on their surfaces. Thus, the deposition rate across the wafer is more uniform. Also, the present invention provides the ability for adjusting the plating rates by adjusting the temperatures on wafers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
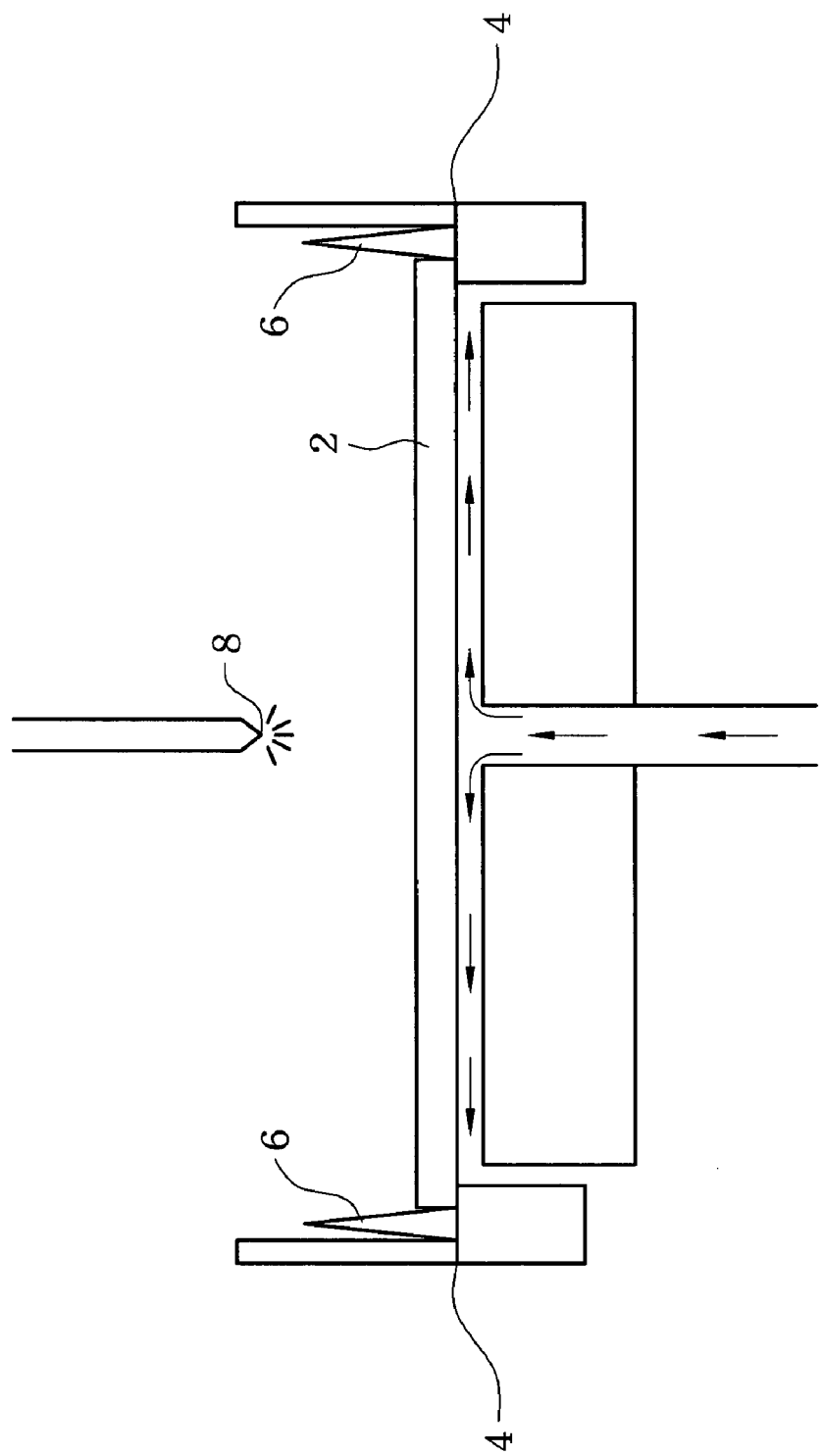
FIG. 1 illustrates a conventional electroless plating apparatus, wherein a wafer is heated by hot de-ionized water.
Figure 2:
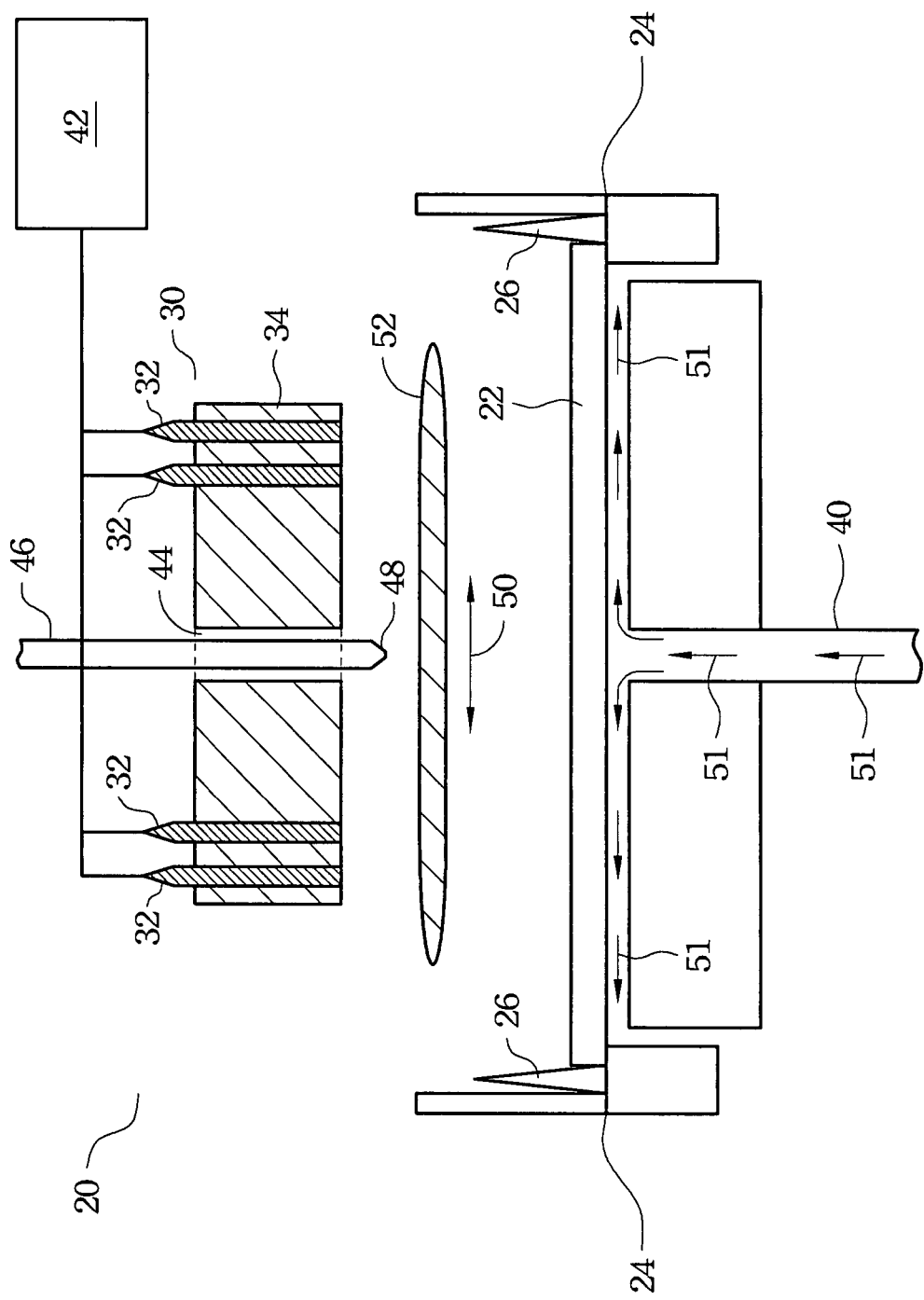
FIG. 2 illustrates an electroless plating apparatus, wherein a radiation source provides heat to a wafer.

FIG. 2 schematically illustrates an exemplary electroless plating apparatus 20, which includes a radiation source 30 for providing heat to wafer 22. Wafer 22 is placed on wafer holder 24. Guide pins 26 in wafer holder 24 are used to confine wafer 22. In electroless plating processes, wafer holder 24 and wafer 22 swivel at a constant speed. Radiation source 30 may be any non-liquid heat source. For example, it may radiate any light with heating ability, such as infrared and/or far infrared lights. Radiation source 30 may include lamp filaments or coils.

Figure 3:
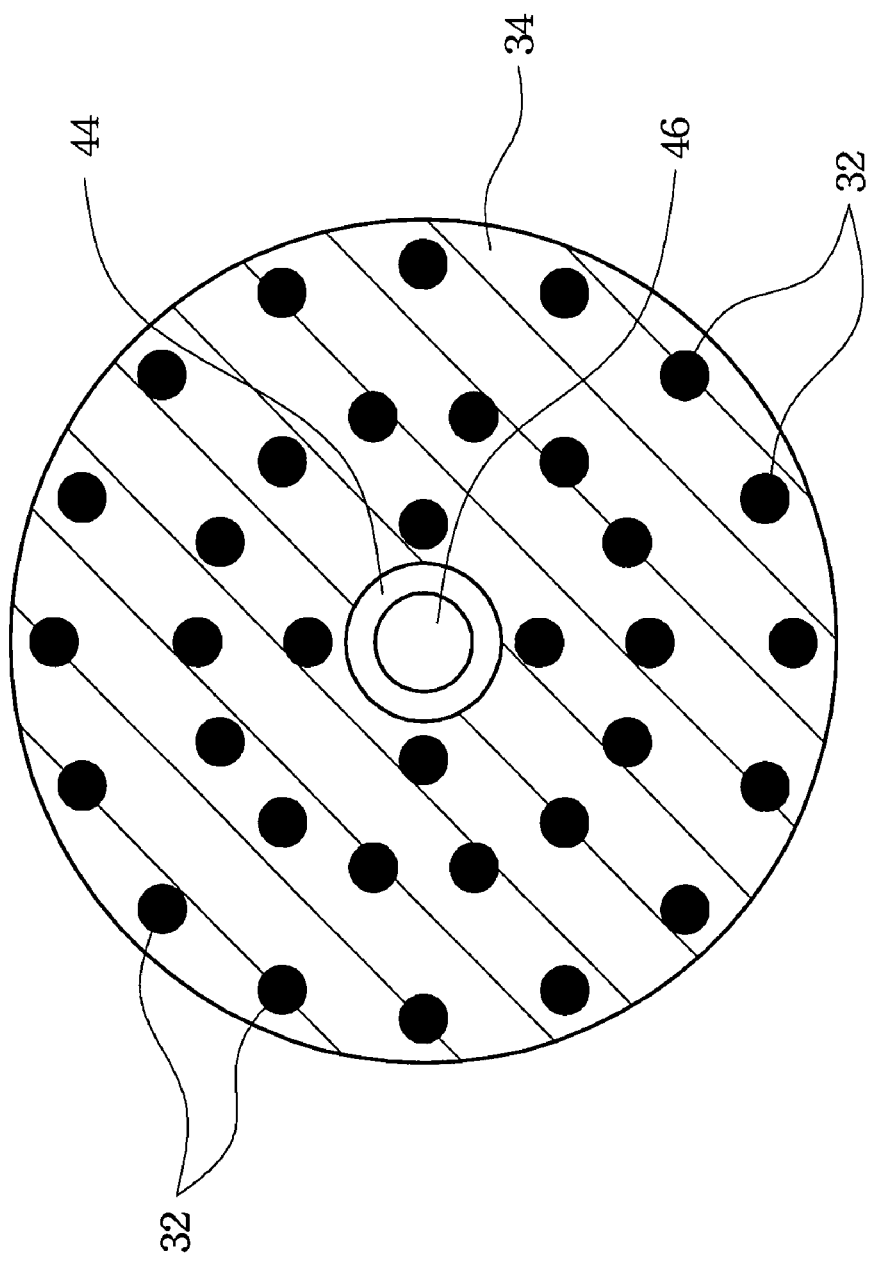
FIG. 3 illustrates a top view of a focus reflector, in which lamps are placed.

In an exemplary embodiment, radiation source 30 includes lamps 32 formed in focus reflector 34. Focus reflector 34 may have a circular shape, as shown in FIG. 3. A plurality of openings is formed in focus reflector 34, in which lamps 32 are placed. Focus reflector 34 is preferably formed of materials having good heat-insulating ability and heat-reflecting ability, such as anodized stainless steel, and the like. Throughout the description, the term "lamp" refers to all heat sources that generate heat, even if the heat sources do not emit visible lights. Each of the lamps 32 may include a coil(s) or a filament(s) for heat generation. The coils or filaments may have a spiral shape extending from the bottom of the openings into the openings, and may even extend to the tops of the openings. Focus reflector 34 helps focus the heat generated by lamps 32 onto wafer 22.

The electroless plating apparatus 20 may optionally include pipe 40 for conducting hot de-ionized (DI) water, wherein the hot DI water is preferably conducted to a center of the bottom surface of wafer 22, and flows in the center-to-edge directions, as illustrated by arrows 51. The hot DI water acts as an additional heat source for heating wafer 22, and preferably has a temperature of between about 50° C. and about 90° C., and more preferably about 80° C.

FIG. 3 illustrates a bottom view of radiation source 30, in an embodiment wherein no hot DI water is provided, the distribution of lamps 32 is adjusted so that wafer 22 receives a uniform heat level throughout the wafer. This may be achieved by, for example, increasing the diameter of the radiation source 30 approximately to, or even greater than, the diameter of wafer 22, and substantially evenly distributing lamps 32 in focus reflector 34. In other embodiments wherein the hot DI water is provided, since the hot DI water will cause a temperature difference between the center portion and the edge portions of wafer 22, the distribution of lamps 32 is adjusted so that radiation source 30 compensates for the temperature difference caused by the hot DI water. In an exemplary embodiment, from the center of radiation source 30 to its edge, the density of lamps 32 increases, so that the edge portions of wafer 22 receives more heat per unit area from radiation source 30. Alternatively, lamps proximate edges of focus reflector 34 are provided with a higher power, while lamps proximate the center are provided with a lower power. As a result, the overall temperature across wafer 22 is substantially uniform.

Referring back to FIG. 2, lamps 32 are connected to power control unit 42, which controls whether to turn on or off lamps 32. In addition, power control unit 42 controls the power level provided to lamps 32. In a first embodiment, power control unit 42 is used to adjust the plating rate for the entire wafer. For example, after a wafer is plated, the wafer is measured to determine the plating rate. If the plating rate is lower than desired, power control unit 42 increases the power to lamps 32. Conversely, power control unit 42 reduces the power to lamps 32 if the plating rate is higher than desired. In a second embodiment, power control unit 42 is used to improve plating uniformity on wafers. For example, if the edge portions of a wafer have lower plating rates than the center portion, power control unit 42 increases the power to the lamps 32 in outer portions of radiation source 30, and hence increase the plating rate in the outer portions of the wafers. Conversely, if the edge portions of wafer 22 have higher plating rates than the center portion, power control unit 42 reduces the power to lamps in outer portions of the radiation source 30. The uniformity of temperatures and plating rates on different spots of wafer 22 is thus improved. The temperature uniformity of wafer 22 can also be determined and improved by using power control unit 42.

Radiation source 30 is preferably integrated with a chemical dispensing system. In an embodiment, opening 44 (also referred to as chemical inlet port 44) is formed at the center of radiation source 30. Conduit 46, which has a first end connected to a chemical dispenser (not shown) and a second end connected to chemical dispensing nozzle 48, is attached through chemical inlet port 44. In an electroless plating process, chemical dispensing nozzle 48 and the connecting conduit 46 move back and forth between a center portion and an edge portion of wafer 22 (as illustrated as arrow 50). Accordingly, radiation source 30 also moves accordingly with chemical dispensing nozzle 48.

The electroless plating apparatus 20 may also include shield plate 52, which has the ability of blocking the heat generated by radiation source 30 from reaching the underlying wafer 22. In the preferred embodiment, radiation source 30 is formed of a material have reflecting ability, for example, the same material as used in focus reflector 34. Shield plate 52 is movable so that it may be moved out of the way when electroless plating is conducted, and moved into the heat path if electroless plating apparatus 20 is idle and/or no wafer is placed on wafer holder 24. With such as scheme, radiation source 30 does not have to be turned off, and constant heat may be provided.

Figure 4A:
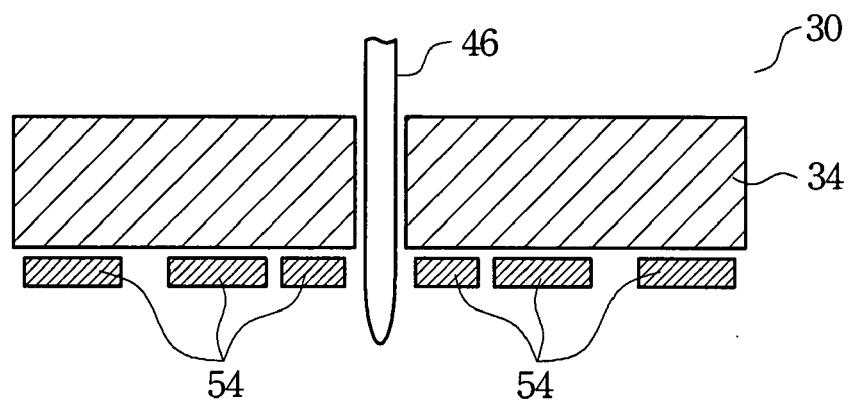
FIGS. 4A and 4B illustrate a cross-sectional view and a bottom view of a radiation source, respectively.
Figure 4B:
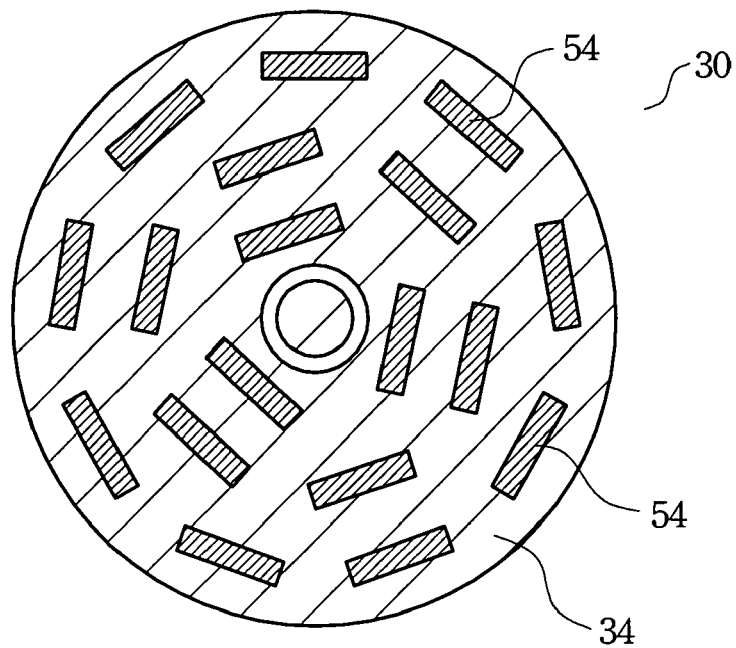
Figure 5:
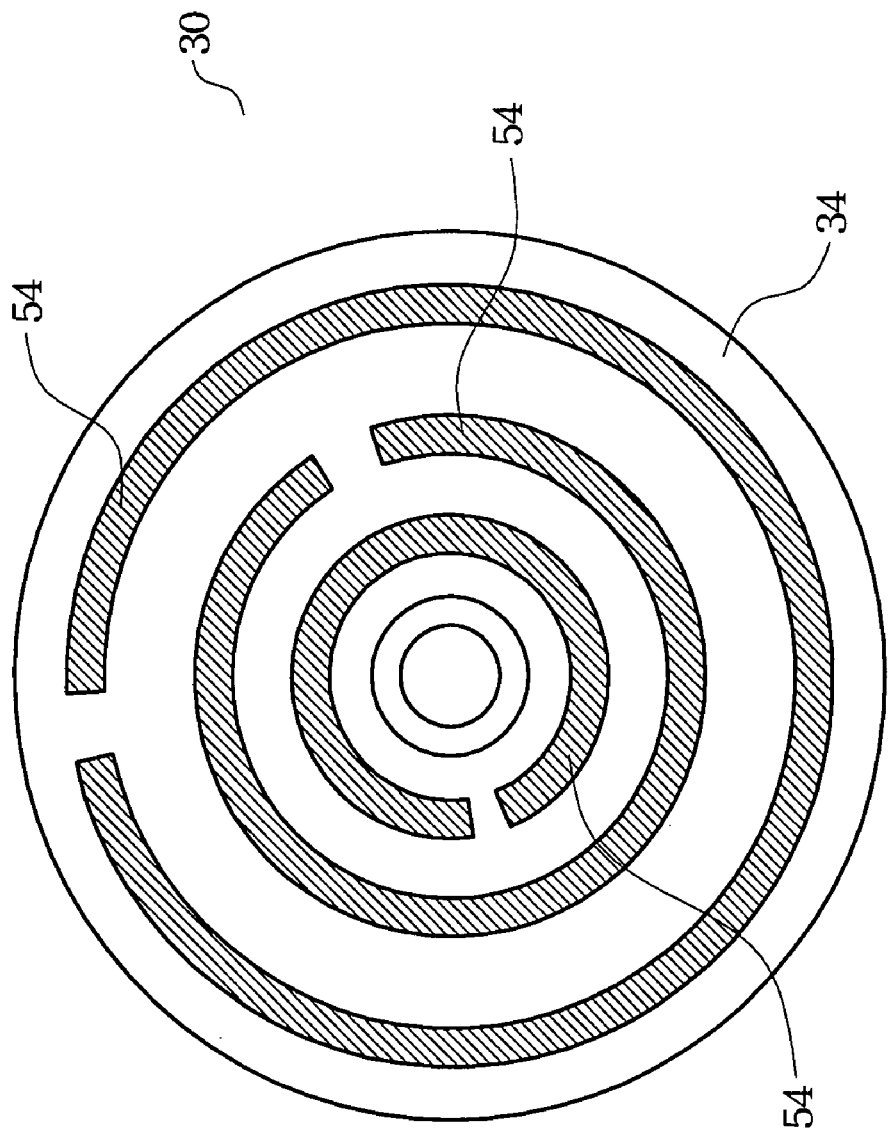
FIG. 5 illustrates a bottom view of lamps attached on a radiation source, wherein lamps are formed as rings.

It is to be realized that radiation source 30 in FIGS. 2 and 3 are only examples, and may have different structures, shapes, materials, etc, as long as they provide uniform heat to wafers to be plated or compensate for the temperature differences between the respective edges and centers of the wafers. FIGS. 4A and 4B illustrate a second embodiment, wherein lamps 54 are horizontally, rather than vertically, placed under focus reflector 34. FIG. 4A illustrates a cross-sectional view of radiation source 30, which shows that lamps 54 are attached to the bottom of focus reflector 34. FIG. 4B illustrates an exemplary bottom view of the radiation source 30 shown in FIG. 4A. Lamps 54 may be arranged in the form of rings, as is illustrated in FIG. 4B, or parallel to each other. In yet other embodiments, as shown in FIG. 5, radiation source 30 includes a plurality of lamps, each forming a loop.

Figure 6:
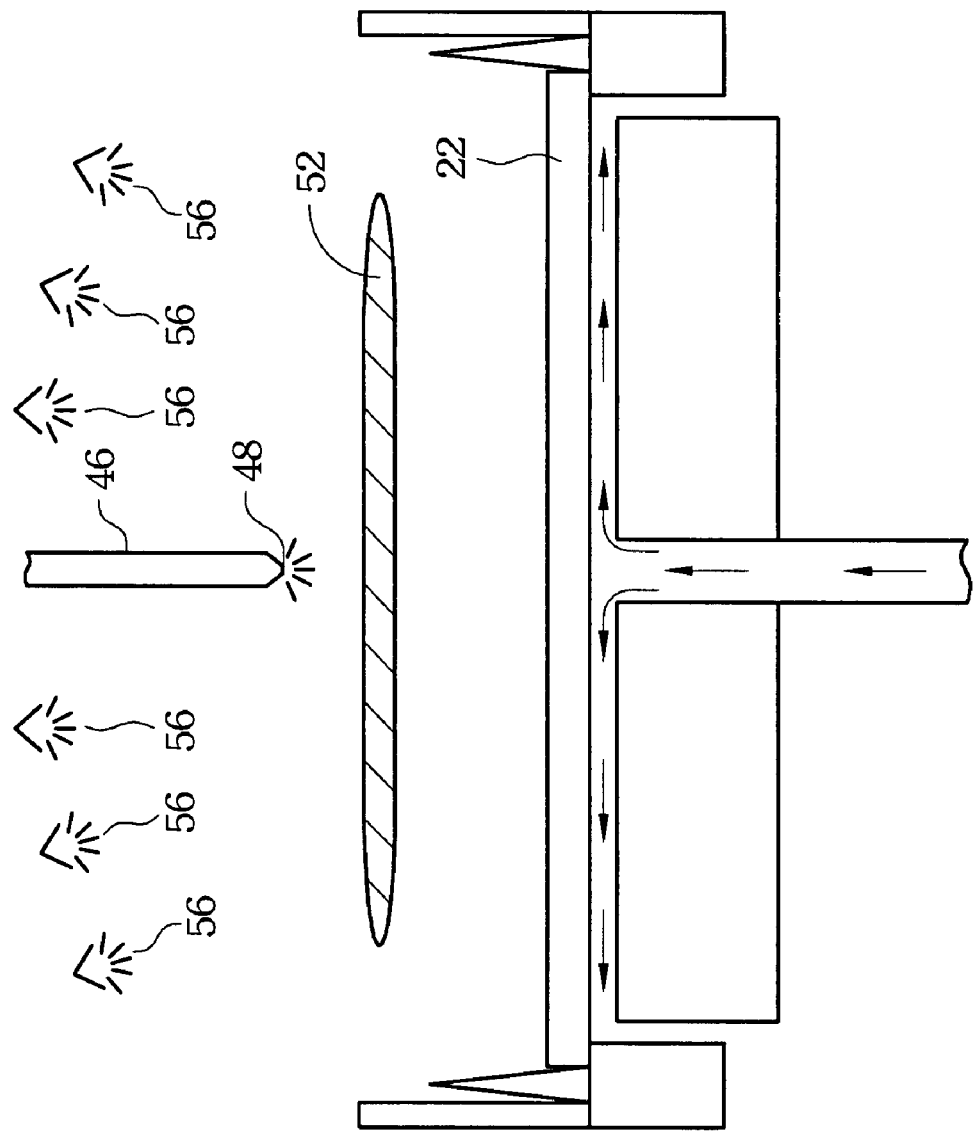
FIG. 6 illustrates an embodiment of the present invention, wherein a wafer is heated by separate lamps.

In yet other embodiments, the radiation source may be separate from chemical dispense conduit 46. FIG. 6 illustrates individual lamps 56 placed in electroless plating apparatus 20. Similar to the embodiment shown in FIG. 2, the individual lamps 56 are preferably distributed in such a way that the resulting wafer 32 has a top surface with a uniform temperature.

By using the embodiments of the present invention, the electroless-plated wafers may have a substantially uniform temperature on their surfaces. As a result, the uniformity of deposition rates across the wafers is improved. Also, the embodiments of the present invention may be used to adjust plating rates.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
an electroless plating apparatus configured to perform an electroless plating on a wafer and comprising:
   a wafer holder;
   a chemical dispensing nozzle over the wafer holder;
   a conduit connected to the chemical dispensing nozzle;
   a radiation source over the wafer holder, wherein the radiation source is configured to heat the wafer; and
   a water pipe having an opening for conducting hot de-ionized water under the wafer, wherein the radiation source is configured to compensate for temperature differences caused by the hot de-ionized water under the wafer.

2. The apparatus of claim 1, wherein the radiation source comprises a plurality of lamps.

3. The apparatus of claim 1, wherein the radiation source comprises:
   a focus reflector; and
   a plurality of lamps attached on the focus reflector.

4. The apparatus of claim 3, wherein the focus reflector is integrated with the conduit.

5. The apparatus of claim 3, wherein the focus reflector comprises a plurality of openings, and wherein each of the plurality of lamps is placed in one of the plurality of openings.

6. The apparatus of claim 3, wherein the focus reflector comprises anodized stainless steel.

7. The apparatus of claim 1 further comprising a power control unit connected to the radiation source.

8. The apparatus of claim 1 further comprising a movable shield plate between the wafer holder and the radiation source.

9. The apparatus of claim 1, wherein the radiation source provides uniform heat to a top surface of the wafer on the wafer holder.

10. The apparatus of claim 1, wherein the radiation source is configured to compensate for a temperature difference between a center and an edge of the wafer on the wafer holder.

11. An electroless plating apparatus for plating a wafer, the electroless plating apparatus comprising:
   a wafer holder for holding the wafer;
   a chemical dispensing nozzle over the wafer;
   a water pipe having an end under the wafer;
   a focus reflector over the wafer; and
   at least one lamp attached to the focus reflector, wherein the focus reflector comprises a plurality of openings distributed throughout the focus reflector, and wherein the at least one lamp is placed in the plurality of openings.

12. The electroless plating apparatus of claim 11, wherein the focus reflector is configured to reflect heat generated from the at least one lamp.

13. The electroless plating apparatus of claim 11, wherein a portion of the at least one lamp near edges of the focus reflector generates more heat than a portion of the at least one lamp near a center of the focus reflector.

14. The electroless plating apparatus of claim 11 further comprising a power control unit connected to the at least one lamp.

15. The electroless plating apparatus of claim 11, wherein the chemical dispensing nozzle is connected to a conduit, and wherein the conduit penetrates through one of the plurality of openings in the focus reflector.

16. The electroless plating apparatus of claim 11 further comprising a shield plate between the wafer and the at least one lamp, wherein the shield plate is movable.

17. The electroless plating apparatus of claim 11, wherein the at least one lamp provides uniform heat to a top surface of the wafer.

18. The electroless plating apparatus of claim 11, wherein the at least one lamp compensates for a temperature difference between a center and an edge of the wafer.

19. The electroless plating apparatus of claim 11, wherein the focus reflector comprises anodized stainless steel.

* * * * *